(12) United States Patent
Andry et al.

(10) Patent No.: US 6,566,687 B2
(45) Date of Patent: May 20, 2003

(54) METAL INDUCED SELF-ALIGNED CRYSTALLIZATION OF SI LAYER FOR TFT

(75) Inventors: Paul S. Andry, Mohegan Lake, NY (US); Frank R. Libsch, White Plains, NY (US); Takatoshi Tsujimura, Fujisawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/765,134

(22) Filed: Jan. 18, 2001

(65) Prior Publication Data

US 2002/0093017 A1 Jul. 18, 2002

(51) Int. Cl.$^7$ ............................................. H01L 29/04
(52) U.S. Cl. ............................ 257/66; 257/65; 257/59; 257/72
(58) Field of Search ........................ 257/66, 59, 72, 257/65

(56) References Cited

U.S. PATENT DOCUMENTS

| | | | |
|---|---|---|---|
| 5,403,772 A | | 4/1995 | Zhang et al. |
| 5,563,426 A | | 10/1996 | Zhang et al. |
| 5,604,360 A | | 2/1997 | Zhang et al. |
| 5,864,149 A | * | 1/1999 | Yamamori ............... 257/59 |
| 5,888,857 A | | 3/1999 | Zhang et al. |
| 5,929,949 A | * | 7/1999 | Park ....................... 349/44 |
| 6,025,218 A | * | 2/2000 | Brotherton ............. 438/166 |
| 6,057,904 A | * | 5/2000 | Kim et al. .............. 349/143 |
| 6,136,702 A | * | 10/2000 | Chandross et al. ..... 438/678 |
| 6,160,271 A | | 12/2000 | Yamazaki et al. |
| 6,245,602 B1 | * | 6/2001 | Ho et al. ................. 438/158 |
| 6,174,745 B1 | * | 1/2002 | Szydlo et al. .......... 438/30 |
| 6,180,438 B1 | * | 1/2002 | Deane et al. ........... 438/149 |
| 2002/0009836 A1 | * | 1/2002 | Takechi .................. 438/151 |
| 2002/0033485 A1 | * | 3/2002 | Morosawa .............. 357/72 |

FOREIGN PATENT DOCUMENTS

| | | | |
|---|---|---|---|
| JP | 2-163971 | * | 6/1990 |
| JP | 6-275835 | * | 9/1994 |
| JP | 7-45519 | | 2/1995 |
| JP | 9-213966 | | 8/1997 |

\* cited by examiner

*Primary Examiner*—Nathan J. Flynn
*Assistant Examiner*—Ahmed N. Sefer
(74) *Attorney, Agent, or Firm*—Scully, Scott, Murphy & Presser; Robert M. Trepp, Esq.

(57) ABSTRACT

The present invention discloses a semiconductor device, a thin film transistor (TFT), and a process for forming a TFT. The semiconductor device according to the present invention comprises a top-gate type thin film transistor (TFT), said top-gate type TFT being formed on a substrate, said top-gate type TFT comprising: an insulating layer deposited on said substrate; a source electrode and a drain electrode formed from a metal-dopant compound, said metal-dopant compound being deposited on said insulating layer; a polycrystalline Si (poly-Si) layer deposited on said insulating layer and said source electrode and said drain electrode; an ohmic contact layer being formed between said metal-dopant compound and said poly-Si layer through migration of said dopant from said metal-dopant compound; a gate insulating layer deposited on said poly-Si layer; and a gate electrode formed on said gate insulating layer, wherein said poly-Si layer is crystallized by metal induced lateral crystallization.

14 Claims, 8 Drawing Sheets

METAL INDUCED SELF-ALIGNED CRYSTALLIZATION OF SI LAYER FOR TFT

BACKGROUND OF THE INVENTION

1. Technical Field

The present invention relates to a semiconductor device, a thin film transistor (TFT), and a process for forming a TFT, and particularly relates to a semiconductor device including a novel top-gate type TFT, a novel top-gate type TFT, and a process for forming a novel top-gate type TFT through metal induced crystallization of amorphous silicon.

2. Prior Art

A thin film transistor (TFT) has been used in wide ranges of semiconductor devices such as an active matrix type liquid crystal display, an organic electroluminescence display, and an image sensors, because a TFT may provide a thin, light weight device with low power consumption. Among TFTs, a TFT, which utilizes polycrystaline silicon (hereafter described as poly-Si), is interested due to its possibility for providing a large area, high resolution device with low production costs.

Conventionally, poly-Si is formed on a substrate such as glass, metal, metal oxide, single crystal silicon by solid phase crystallization or laser crystallization. Typical solid phase crystallization includes steps of depositing an amorphous silicon (a-Si) layer, and heating the layer from about 400 Celsius degrees to 550 Celsius degrees between several hours and several tens hours to crystallize the a-Si layer. In turn, typical laser crystallization includes steps of irradiating the a-Si layer to fuse a-Si at irradiated spots, and re-crystallizing Si upon cooling to ambient temperature.

FIG. 1 shows a process for the solid phase crystallization applied to a top-gate type TFT. In the conventional process, as shown FIG. 1(a), the a-Si layer 102 is deposited on a substrate 101 and then the Ni layer 103 is deposited thereon by a suitable deposition technique. The substrate 101 together with the deposited layers are then subjected to annealing from 400 Celsius degrees to 550 Celsius degrees, thereby crystallizing the a-Si layer to the poly-Si layer 104 induced by a crystal structure of the Ni layer 103 as illustrated in FIG. 1(b). In the described case of FIG. 1(b), crystal boundaries 104a, 104b are formed randomly in the poly-Si layer 104. Next, the conventional process proceeds to the gettering process shown in FIG. 1(c) and the Ni layer 103 is subjected to HF treatment and anneal treatment to remove the Ni layer 103 by gettering process. Thereafter, as depicted in FIG. 1(d), the gate insulating layer 105 is deposited on the poly-Si layer 104 and the gate electrode 106 are formed on the poly-Si layer 104. Next, the N+ doping is applied by a suitable technique such as reactive ion doping of $^{31}P^+$ to provide source and drain electrodes.

The conventional TFT having the poly-Si layer formed by the conventional metal induced crystallization shows sufficient performance, however, still has disadvantages such as unevenness in both of on-current and off-current because of randomly created crystal boundaries in the poly-Si layer. In addition, since the removing process of Ni after depositing thereof and the doping process are needed to form the device and then the production process becomes rather complicated.

Japanese patent publication (Laid Open) Heisei No. 7-45519 discloses a semiconductor device and a process for forming thereof, wherein poly-Si is generated by crystallization of a-Si by annealing at the temperature lower than the crystallization temperature of a-Si or lower than a glass transition temperature of a given glass substrate using islands deposited with Ni, Fe, Co, Ru, Rh, Pd, Os, Ir, Pt, Sc, Ti, V, Cr, Mn, Cu, Zn, Au, Ag, or silicides thereof. These islands act as seeds for crystallization and the resulted crystal boundaries are formed under the controlled manner. The disclosed semiconductor device exhibited a sufficient performance, however, the crystal boundaries still have randomness so that the unevenness in the on- and off-currents may be caused. The production process still requires removing step of the Ni layer and also requires the doping step.

Japanese Patent Publication (Laid Open) Heisei No. 9-213966 discloses a process for forming a semiconductor device, wherein an a-Si layer is crystallized using laser irradiation and a TFT device having an poly-Si layer with large crystal size is disclosed. Although the TFT device obtained has sufficient low leak current when the TFT is off. The crystallization by the laser irradiation may improve unevenness of the crystal boundaries and may provide large crystal size in the poly-Si layer as described above, however, the process requires a laser system so that capital investment for constructing an industrial scale plant becomes huge and therefore, directs to elevation of device costs. In addition, though the laser irradiation provides large crystal size in the poly-Si layer, still larger crystal size is desired to improve device properties.

Therefore, it is needed so far to provide a semi-conductor device which the on- and off-current of TFT is improved and that is produced with more simplified process.

It is also needed so far to provide the top-gate type TFT which has improved on- and off-current properties and that is produced with more simplified process.

It is still needed so far to provide a process for forming the TFT which has improved on- and off-current properties and that is produced with more simplified process.

SUMMARY OF THE MENTION

Therefore, it is an object of the present invention to provide the semiconductor device which the on- and off-current of TFT is improved and that is produced with more simplified process.

It is also another object of the present invention to provide the top-gate type TFT which has improved on- and off-current properties and that is produced with more simplified process.

It is still another object of the present invention to provide a process for forming the TFT which has improved on- and off-current properties and that is produced with more simplified process.

The present invention is partly based on the findings that the metal-dopant compound acts excellent electrodes for the top-gate type TFT when the crystallization of a-Si is carried out on the layer formed with metal-dopant compound.

According to the present invention, a semiconductor device comprising a top-gate type thin film transistor (TFT) is provided. According to the present invention, a semiconductor device comprises a top-gate type thin film transistor (TFT), said top-gate type TFT is formed on a substrate and comprises:

- an insulating layer deposited on said substrate;
- a source electrode and a drain electrode formed from a metal-dopant compound, said metal-dopant compound being deposited on said insulating layer;
- a polycrystalline Si (poly-Si) layer deposited on said insulating layer and said source electrode and said drain electrode;

an ohmic contact layer being formed between said metal-dopant compound and said poly-Si layer through migration of said dopant from said metal-dopant compound;

a gate insulating layer deposited on said poly-Si layer; and a gate electrode formed on said gate insulating layer, wherein said poly-Si layer is crystallized by metal induced lateral crystallization.

According to the present invention, said metal-dopant compound may comprise the elements selected from the group consisting of Ni, Fe, Co, Pt, Mo, Ti, B, and P.

According to the present invention, the metal-dopant compound may be NiP or NiB.

According to the present invention, said metal-dopant compound may be NiP and a concentration of P may range from 0.5 at % to 10 at %.

According to the present invention, said metal-dopant compound may be NiB and a concentration of B may range from 0.25 at % to 2.0 at %.

According to the present invention, a light shielding layer may be formed on said substrate and a plurality of said TFTs may be arrayed to form an active matrix in said semiconductor device such that said semiconductor device is used as an active matrix liquid crystal display.

According to the present invention, a plurality of said TFTs may be arrayed to form an active matrix in said semiconductor device such that said semiconductor device is used as an active matrix electro-luminescence display, or an image sensor.

According to the present invention, a top-gate type thin film transistor (TFT) is provided. Said top-gate type TFT is formed on a substrate and comprises:

an insulating layer deposited on said substrate;

a source electrode and a drain electrode formed from a metal-dopant compound, said metal-dopant compound Ni being deposited on said insulating layer;

a polycrystalline Si (poly-Si) layer deposited on said insulating layer and said source electrode and said drain electrode;

an ohmic contact layer being formed between said metal-dopant compound and said poly-Si layer through migration of said dopant from said metal-dopant compound;

a gate insulating layer deposited on said poly-Si layer; and a gate electrode formed on said gate insulating layer, wherein said poly-Si layer is crystallized by metal induced lateral crystallization.

According to the present invention, said metal-dopant may comprise the elements selected from the group consisting of Ni, Fe, Co, Pt, Mo, Ti, B, and P.

According to the present invention, said metal-dopant compound may be NiP or NiB.

According to the present invention, said metal-dopant compound may be NiP and a concentration of P may range from 0.5 at % to 10 at %.

According to the present invention, said metal-dopant compound may be NiB and a concentration of B may range from 0.25 at % to 2.0 at %.

According to the present invention, a light shielding layer may be formed on said substrate and a plurality of said TFTs may be arrayed to form an active matrix such that said top-gate type TFTs are included in an active matrix liquid crystal display.

According to the present invention, a plurality of said TFTs may be arrayed to form an active matrix such that said top-gate type TFTs are included in an active matrix electro-luminescence display, or an image sensor.

According to the present invention, a process for forming a top-gate type TFT is provided. The process comprises steps of;

providing a substrate for supporting a TFT structure;

depositing an insulating layer on said substrate;

depositing a metal-dopant compound on said insulating layer;

patterning said metal-dopant compound to form a source electrode and a drain electrode;

depositing an a-Si layer on said insulating layer and said metal-dopant compound;

depositing a gate insulating layer on said a-Si layer;

depositing gate material on said gate insulating layer;

patterning said layers to form a top-gate type TFT structure on said substrate; and annealing said a-Si layer to obtain a polycrystalline Si (poly-Si) layer having a self-aligned crystal boundary and to form an ohmic contact layer between said metal-dopant compound and said poly-Si layer.

According to the present invention, crystallization of said a-Si layer starts from outer lateral locations of said a-Si layer and proceeds to the inside of said a-Si layer such that a crystal boundary is formed at about middle portion of said poly-Si layer in a self-aligned manner.

According to the present invention, said metal-dopant compound may comprise the elements selected from the group consisting of Ni, Fe, Co, Pt, Mo, Ti, B, and P.

According to the present invention, said metal-dopant compound may be NiP or NiB.

According to the present invention, the process may further comprise a step of depositing a light shielding layer on said substrate.

According to the present invention, a process for forming a top-gate type TFT is provided. The process comprises steps of;

providing a substrate for supporting a TFT structure;

depositing an insulating layer on said substrate;

depositing a metal-dopant compound on said insulating layer;

patterning said metal-dopant compound to a first patterning process to form a source electrode and a drain electrode;

depositing an a-Si layer on said insulating layer and said metal-dopant compound;

annealing said a-Si layer to obtain a polycrystalline Si (poly-Si) layer having a self-aligned crystal boundary and to form an ohmic contact layer between said metal-dopant compound and said poly-Si layer;

depositing a gate insulating layer on said poly-Si layer;

depositing gate material on said gate insulating layer; and patterning said layers to form said top-gate type TFT structure on said substrate.

Herein below, the present invention will be understood by detailed description thereof accompanied with non-limiting embodiments described in drawings.

BRIEF DESCRIPTION OF DRAWINGS

Preferred embodiments of the present invention will now be described, by way of example only, with reference to the accompanying drawings in which.

DETAILED DESCRIPTION OF THE PREFERRED EMBODIMENTS OF THE INVENTION

Figure 1A:
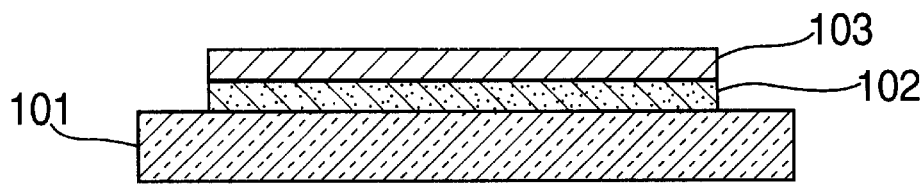
FIG. 1 shows a conventional structure and a production process of top-gate type TFT.
Figure 1B:
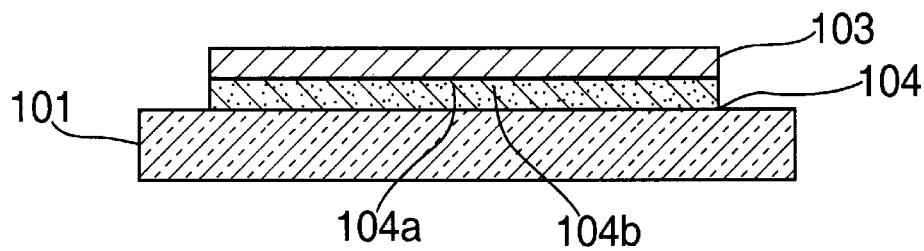
Figure 1C:
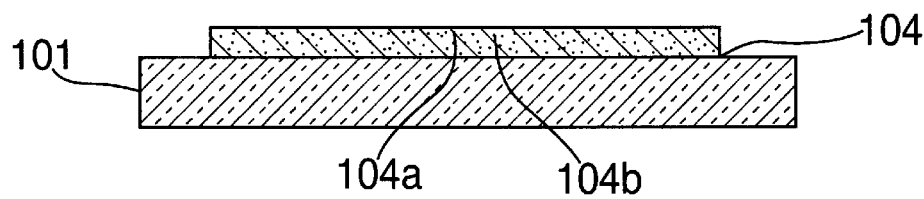
Figure 1D:
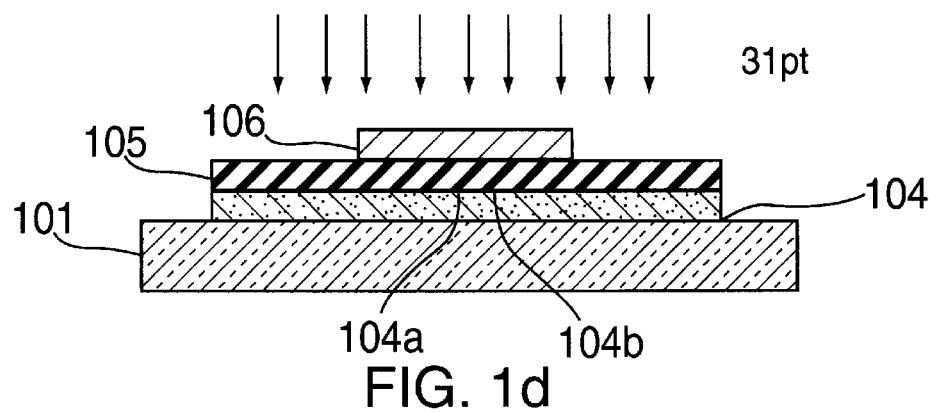
Figure 1E:
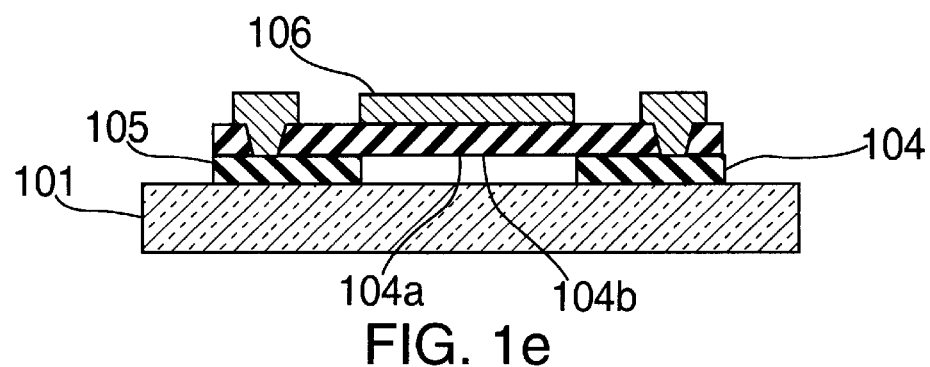
Figure 2:
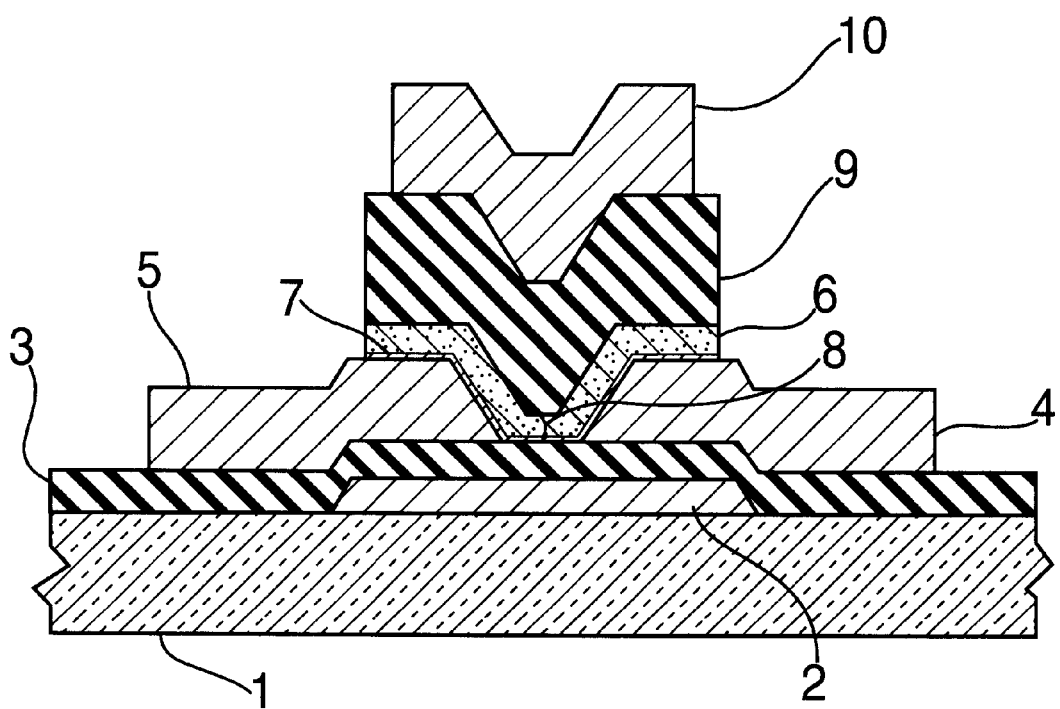
FIG. 2 shows a TFT according to the present invention.

FIG. 2 shows a schematic cross sectional view of a top-gate type TFT which is suitably used for a liquid crystal display device according to the present invention. The top-gate type TFT depicted in FIG. 2 comprises a substrate 1, a light shielding layer 2, and an insulating layer 3. The substrate 1 may be selected from alkaline glass such as soda-lime glass, boro-silicate glass, alumino-boro-silicate glass as well as non-alkaline glass which substantially contains no alkaline elements, and quartz glass. The light shielding layer 2 is deposited on the substrate 1 by a suitable deposition method such as sputtering or vacuum evaporation so as to shielding light through the substrate 1. When a semiconductor device according to the present invention is used as an electro-luminescence device or CCD, since the transparency of the substrate 1 is not necessary, the substrate 1 may be selected from any suitable substrate selected from glass, metal, metal oxide, ceramics, single crystal silicon etc. depending on specific usage.

The light shielding layer 2 may be selected from a germanium compound such as GeSi:H, $Ge_x$, $GeN_x$, a niobium compound such as $Nb_x$, chromium (Cr) and a Molybdenum (Mo) or alloys thereof such as MoCr. A thickness of the light shielding layer 2 may preferably range from about 200 nm to 300 nm. The insulating layer 3 of $SiO_x$ is also deposited on the substrate 1 and the light shielding layer 2 to prevent a current from leaking through the shielding layer 2 and also to improve a performance of the liquid crystal display. The insulating layer 3 may be selected from insulating material such as, for example, $SiN_x$, or $SiO_xN_y$ other than $SiO_x$ so far as an acceptable performance is obtained.

A source electrode 4 and a drain electrode 5 are formed on the insulating layer, 3. In the embodiment illustrated in FIG. 2, the source and drain electrodes 4, 5 are made of a NiP alloy having a thickness of about 200 nm. We found that the NiP alloy may suitably induce the crystallization of a-Si to poly-Si with a sufficient crystal size due to metal induced crystallization caused by NiP while providing ohmic contact between NiP and poly-Si by simultaneous doping of P originated from NiP. In the present invention, other alloys prepared from the group consisted of Ni, Fe, Co, Pt, Mo, Ti, P, and B may be useful to provide the metal induced crystallization and sufficient ohmic contacts with poly-Si. In the TFT structure shown in FIG. 2, a poly-Si layer 6 is formed on the source and drain electrodes 4, 5. The poly-Si layer 6 is formed by metal induced crystallization of a-Si deposited by a plasma CVD process through annealing.

A concentration of P or B included in the metals as essential dopants to Si may range from 0.25 to 10 at % for the concentration of P, and more preferably range from 0.5 to 2.0 at % for the concentration of B in the present invention so as to make volume resistivity of the doped poly-Si layer 6 to be order of $10^{-2}$ cm so that ohmic contacts between the electrodes 4, 5 and the poly-Si layer 6 are achieved.

Figure 3:
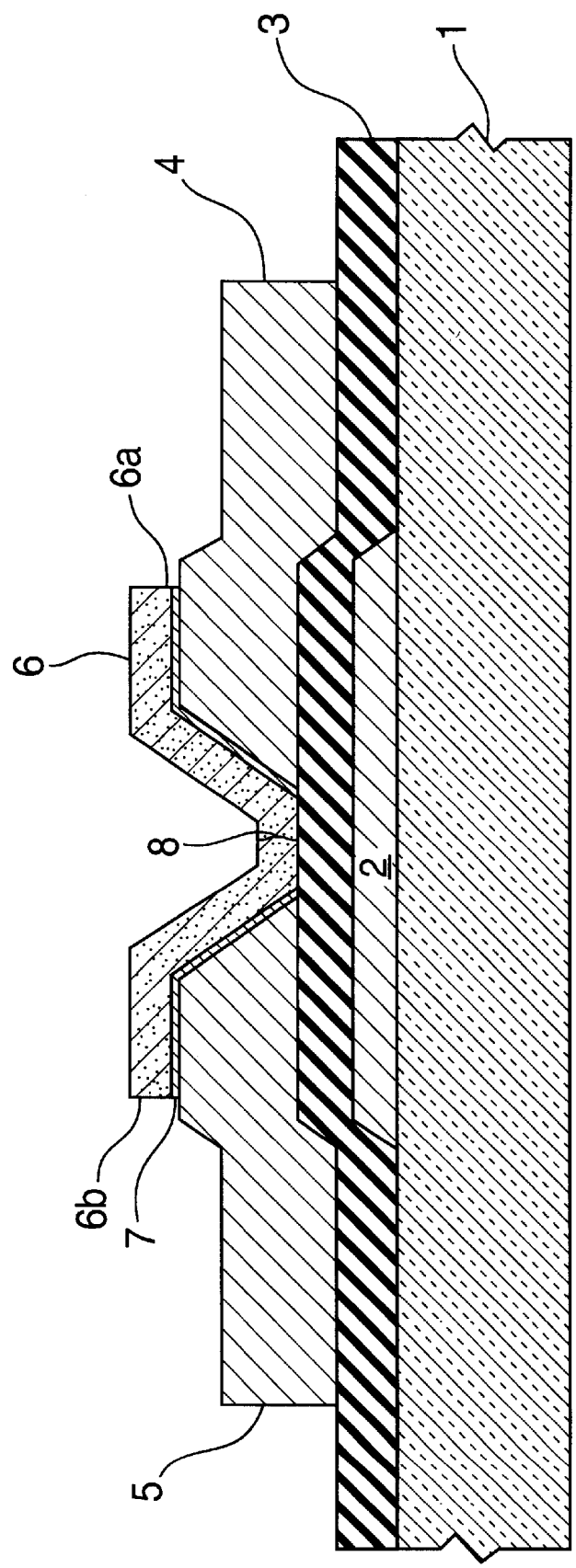
FIG. 3 shows an enlarged layer structure of the TFT structure according to the present invention.

FIG. 3 shows an enlarged cross sectional view of around the source electrode 4, and the drain electrode 5. Upper layers shown in FIG. 2 are not described for simplifying the explanation. As shown in FIG. 3, when the poly-Si layer is provided by annealing, a contact layer 7 is also formed by migration of the P atoms from the source electrode 4 and the drain electrode 5 such that the ohmic contacts between the electrodes 4, 5 and the poly-Si layer 6 are achieved and defects when devised to a liquid crystal panel are prevented. The inventors found that such ohmic contacts was obtained by migration of the P atoms segregated at crystal boundaries of NiP under annealing. In the embodiment shown in FIG. 3, the crystal boundaries may be present between the electrodes 4, 5 and poly-Si layer 6 in addition to the crystal boundary 8, therefore P segregates effectively and evenly at the contacted surface. Then the a-Si layer adjacent to NiP is well doped by the segregated P atoms while being transformed to poly-Si under annealing for the metal induced crystallization, simultaneously. The present invention, as described above, excludes the doping step included in the conventional production process so that the production process of the TFT structure may be significantly simplified, thereby lowering the cost of the semiconductor device including the TFT structure of the present invention.

FIG. 3 also shows the crystal boundary 8 which is formed at about the middle portion of the crystallized poly-Si layer 6. The poly-Si layer 6 may start to crystallize from the lateral sides 6a, 6b of the a-Si layer and the crystallization reaches to the middle of the poly-Si layer 6 in the described embodiment at equal rates, thereby forming the self-aligned crystal boundary 8 at the middle of the poly-Si layer (Metal Induced Lateral Crystallization). The crystallization also occurs from surfaces of the source electrode 4 and the drain electrode 5 to upward direction and then unevenness of the off-current and the on-curent is reduced due to a well-defined polycrystalline structure and uniform layer boundaries between the electrodes 4, 5 and poly-Si layer 6. It is also possible that the crystallization starts any lateral locations in the a-Si layer in the present invention, however, the crystal boundary may be possibly formed about the middle of the poly-Si layer 6 as far as the temperature distribution in the a-Si layer is evenly distributed.

Again referring to FIG. 2, the gate insulating layer 9 and the gate electrode 10 is formed on the poly-Si layer 6 to provide the top-gate type TFT device structure. The gate insulating layer 9 may be formed from material which is etched easier than the insulating layer 3. In the embodiment depicted in FIG. 2, the insulating layer 3 is formed with $SiO_x$ and the gate insulating layer 9 is formed with $SiN_x$ by a suitable method well-known in the art such as, for example, plasma CVD using $SiH_4+NH_3$.

The gate electrode 10 may be formed from any well-known metal or alloys selected from the group consisted of Al, Ta, Cr, Mo, MoTa, ITO and any alloy formed therefrom. The deposition of the gate material may be conducted by any suitable method such as, for example, chemical vapor deposition, physical vapor deposition such as sputtering or vacuum evaporation.

Figure 4:
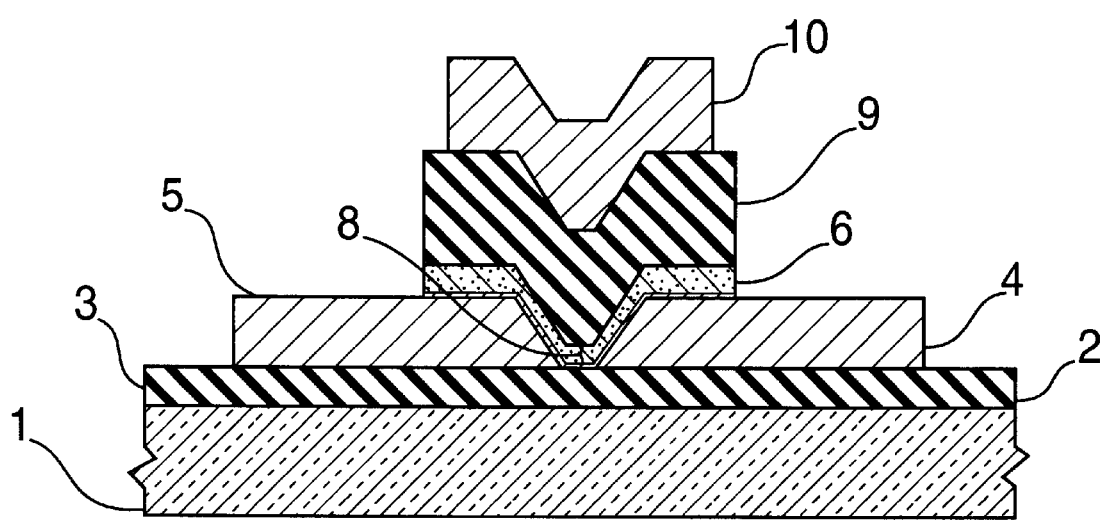
FIG. 4 shows another embodiment of the TFT structure according to the present invention.

FIG. 4 shows another embodiment of the TFT structure according to the present invention. The TFT structure depicted in FIG. 4 may be included in, for example, an electro-luminescence display device. As shown in FIG. 4, the TFT structure has same structure with the TFT structure depicted in FIG. 3 except for not depositing the light shielding layer 2, because the electro-luminescence display device shown in FIG. 4 is assumed to be constructed using a non-transparent substrate 1. The same TFT structure is also applied to construct an image sensor such as a charge coupled device (CCD) when coupled with an suitable substrate.

FIG. 5 shows structures formed on the substrate 1 by each of process steps for forming the TFT structure. In the described embodiment in FIG. 5, the TFT is assumed to be used for a liquid crystal display device. As depicted in FIG. 5(a), first the light shielding layer 2 is deposited on the substrate 1 by any suitable deposition technique such as chemical vapor deposition, sputtering, or evaporation subsequently patterned to a desired shape by patterning steps, such as photolithography.

Figure 5A:
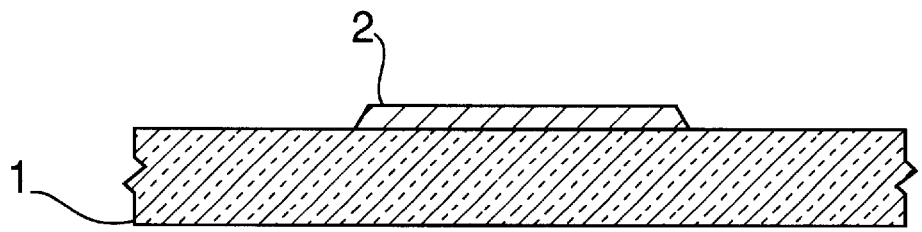
FIG. 5 shows structures formed on the substrate by each of a process steps for forming the TFT structure used for a liquid crystal display device according to the present invention.
Figure 5B:
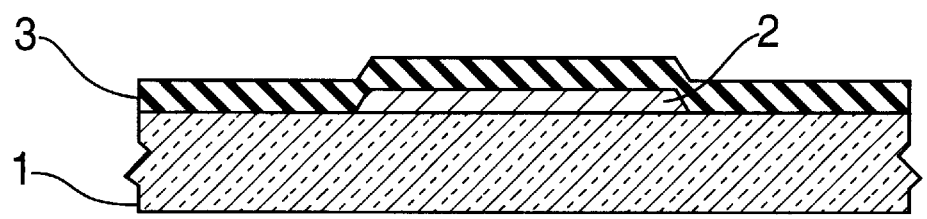

Next the process proceeds to a depositing step of the insulating layer 3 as shown in FIG. 5(b). The insulating layer 3 is deposited to cover the substrate 1 and light shielding layer 2. In the described embodiment, the insulating layer is formed by depositing $SiO_x$ using plasma CVD on the substrate 1.

Figure 5C:
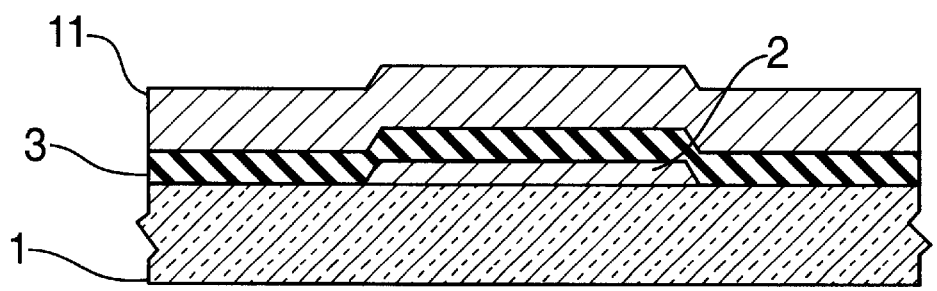

Next the process according to the present invention proceeds to a depositing step of the NiP or NiB layer 11 as shown in FIG. 5(c). Such the NiP or NiB layer may be deposited by any suitable deposition method such as CVD, sputtering, evaporation, or plating. Useful deposition methods include sputtering and plating in the present invention. When the sputtering method is used to deposit the NiP layer 11, a suitable composite target, which already contains the desired concentration of P in Ni is used, since pure P targets are not readily available or practical.

When the sputtering method is used to deposit the NiB layer, either a composite target or two separate targets may be used, since B targets are readily available. If the separate targets are used, the concentration of dopant B may be adjusted in the alloy based on Ni so as to optimize the performance of the TFT device. The sputtering method may be selected from any well-known methods and anyone skilled in the art may easily select the condition for the sputtering. Typical condition is, for example, Ar between 10 and 200 mtorr under RF or DC discharge with power ranging from 200 W to 3 kW depending on a target area.

In another embodiment of the present invention, the NiP or the NiB layer 11 may be advantageously obtained by electroless plating. Plating solutions for NiP may be prepared by mixing sodium hypophosphite monohydrate (reducing agent), sodium citrate (complexing agent), and nickel sulphate. This mixture may contain a surface active agent and other additives which are designed to stabilize the mixture in an electroless plating bath. When the electroless plating is used to deposit the NiP or NiB layer 11, the pH of the electroless plating solution may typically be from 4 to 5 (slightly acidic) or from 8 to 10 (basic).

The basic solutions may be prepared by adding ammonium hydroxide and boric acid. The bath used to plate the NiB layer employs DMAB (Dimethylamine-Borane) as a reducing agent which is commercially available from Shipley Company, L. L. C. An amount of P or B in the deposited NiP or NiB may vary as a function of the pH of the electroless plating bath. The inventors found that the amount of P in NiP may range from 5 to 10 at % and the amount of B in NiB may be much less than P in NiP and may typically range from 0.25 to 1 at % in the electroless plating.

Figure 5D:
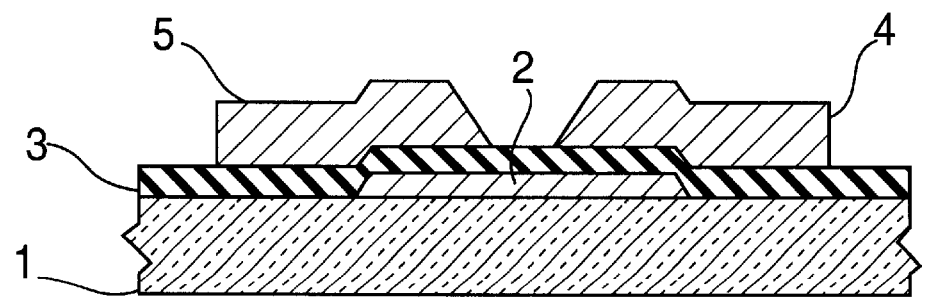

FIG. 5(d) shows the TFT structure of the present invention after etching the NiP or NiB layer 11. The process proceeds after depositing the NiP or NiB layer 11 to the patterning process using suitable well-known photoresists to form the source and drain electrodes 4, 5 as shown in FIG. 5(d). In the patterning process, i.e., photo engraving process shown in FIG. 5(d), any photoresist in positive working or negative working may be used so far as the desired micro-pattern shown in FIG. 5(d) is obtained.

Subsequently, the NiP or NiB layer 11 is etched by an etchant comprising $H_3PO_4$, $HNO_3$, and $CH_3COOH$ (PAN). The NiP layer becomes easier to etch as the concentration of the dopant becomes higher and higher. For etching of NiB layer, which has much less dopant concentration, the etching rate is quite low with the etching by PAN, and therefore stronger $HNO_3$ is used to etch the NiB layer. Other etchants may be used in the present invention as far as the NiP or NiB layer could be etched adequately.

Figure 6A:
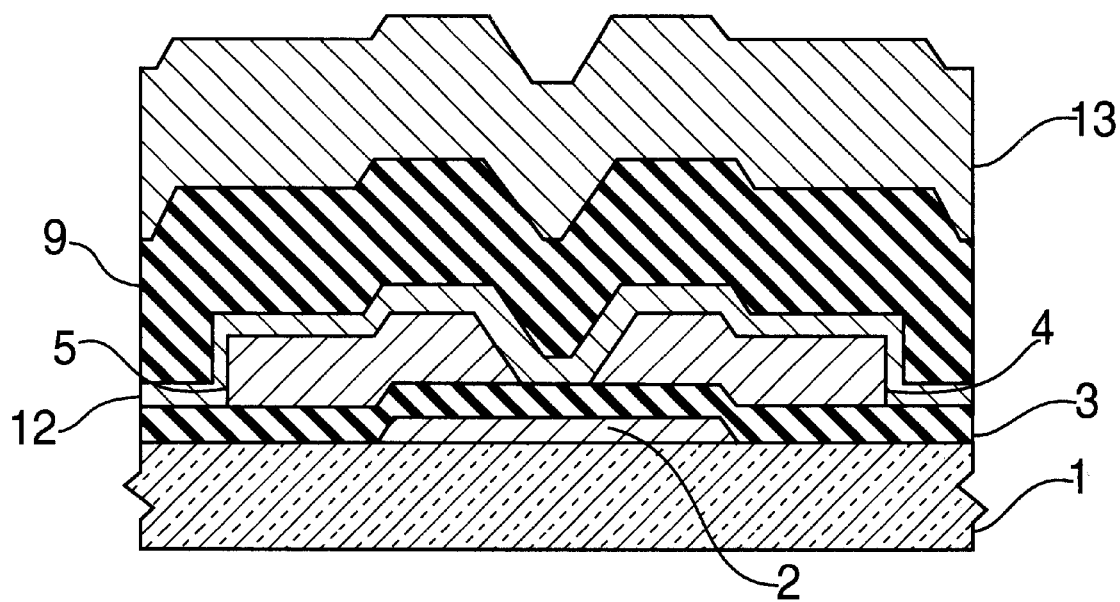
FIG. 6 shows structures formed on the substrate by each of a process steps for forming the TFT structure used for a liquid crystal display device according to the present invention.

Thus patterned source electrode 4 and drain electrode 5 are further covered by depositing the a-Si layer 12 having about 200 nm thickness using plasma CVD. In the described process, subsequently the gate insulating layer 9 comprising SiN, and the gate electrode material 13 comprising, for example, Al are deposited on the a-Si layer 12 to form the TFT structure. FIG. 6(a) shows the structure after the above depositions have been carried out.

Figure 6B:
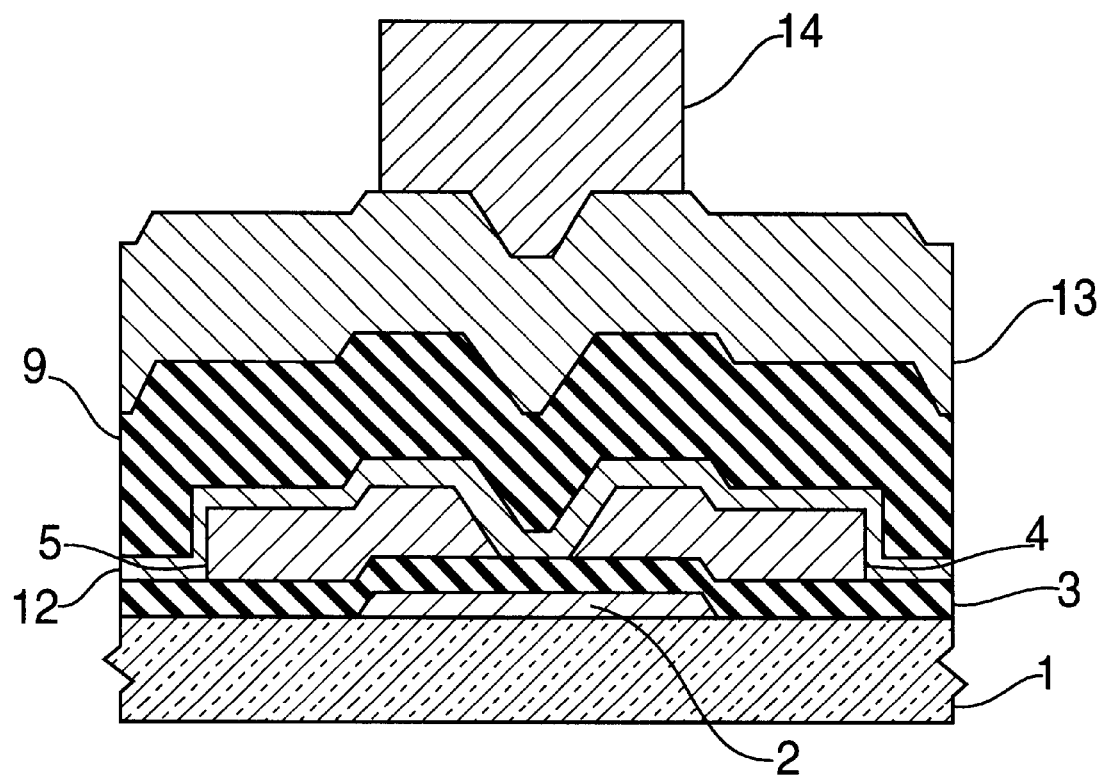

Next a photoresist layer is applied on the gate electrode material 13 and the photoresist layer is exposed by UV light through a photo-mask (not shown) followed by developing, the photoresist pattern 14 being formed on the gate electrode material 13 as shown in FIG. 6(b).

Figure 7A:
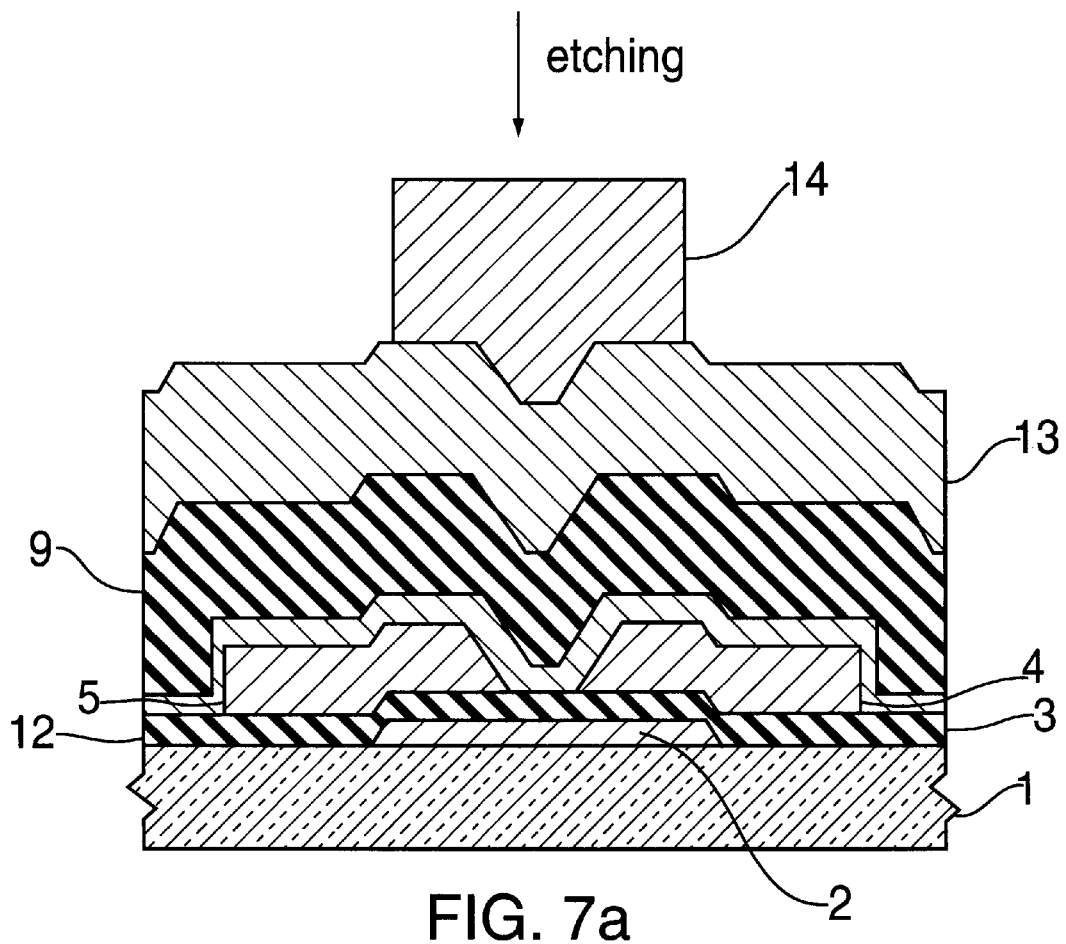
FIG. 7 shows the TFT structure of the present invention before and after etching the NiP or NiB layer.
Figure 7B:
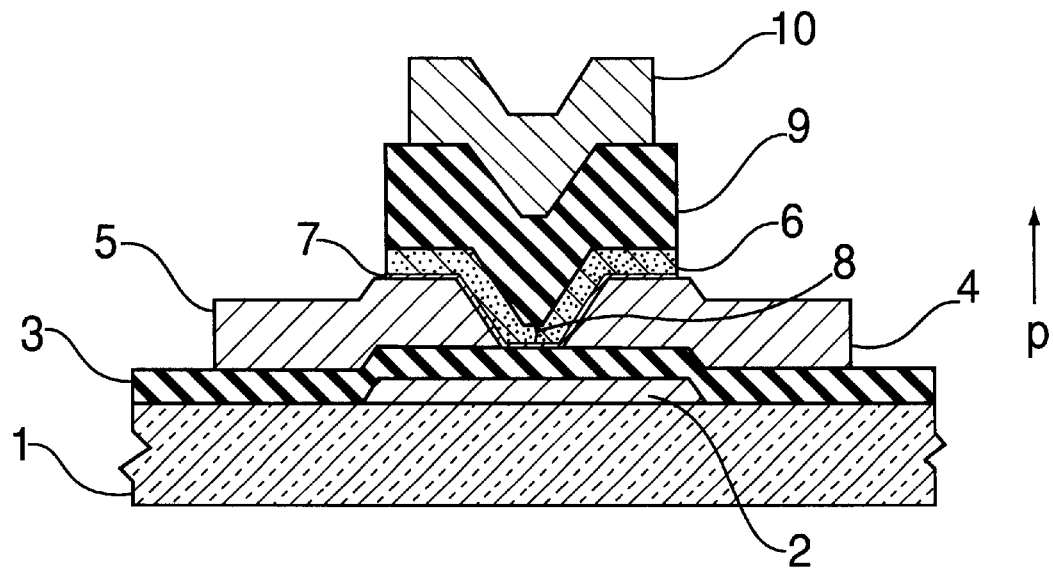

In the next step, the gate electrode material 13, the gate insulating layer 9, and the a-Si layer 12 are etched out to form the TFT structure according to the present invention as shown in FIG. 7. The etching of the gate electrode material 13 may be carried out by isotropic etching using an aqueous solution selected from the groups consisting of $H_3PO_4$, $HNO_3$, $CH_3COOH$, and any mixture thereof as an etchant. The present invention may adopt a dry etching process in which HCl or $BCl_3$ is used as an etchant. It is preferred to over-etch the gate electrode material 13 so as to obtain an offset length around the gate electrode 10 as shown in FIG. 7(b). The etching process further proceeds to etching of the gate insulating layer 9 and the a-Si layer 12 by non-isotropic etching such as reactive ion etching (RIE) using a mixture of $CF_4$ and $O_2$ as an etchant.

The TFT structure thus obtained is then subjected to annealing for crystallizing the a-Si layer 12 into the poly-Si layer 6 through metal induced process at the temperature from 400 Celsius degrees to 550 Celsius degrees from several hours to several tens hours. During annealing, P segregates around the crystal boundaries and the segregated P effectively migrates into Si to form the contact layer 7. The above annealing may be applied in the earlier step just after deposition of the a-Si layer 12.

Figure 8:
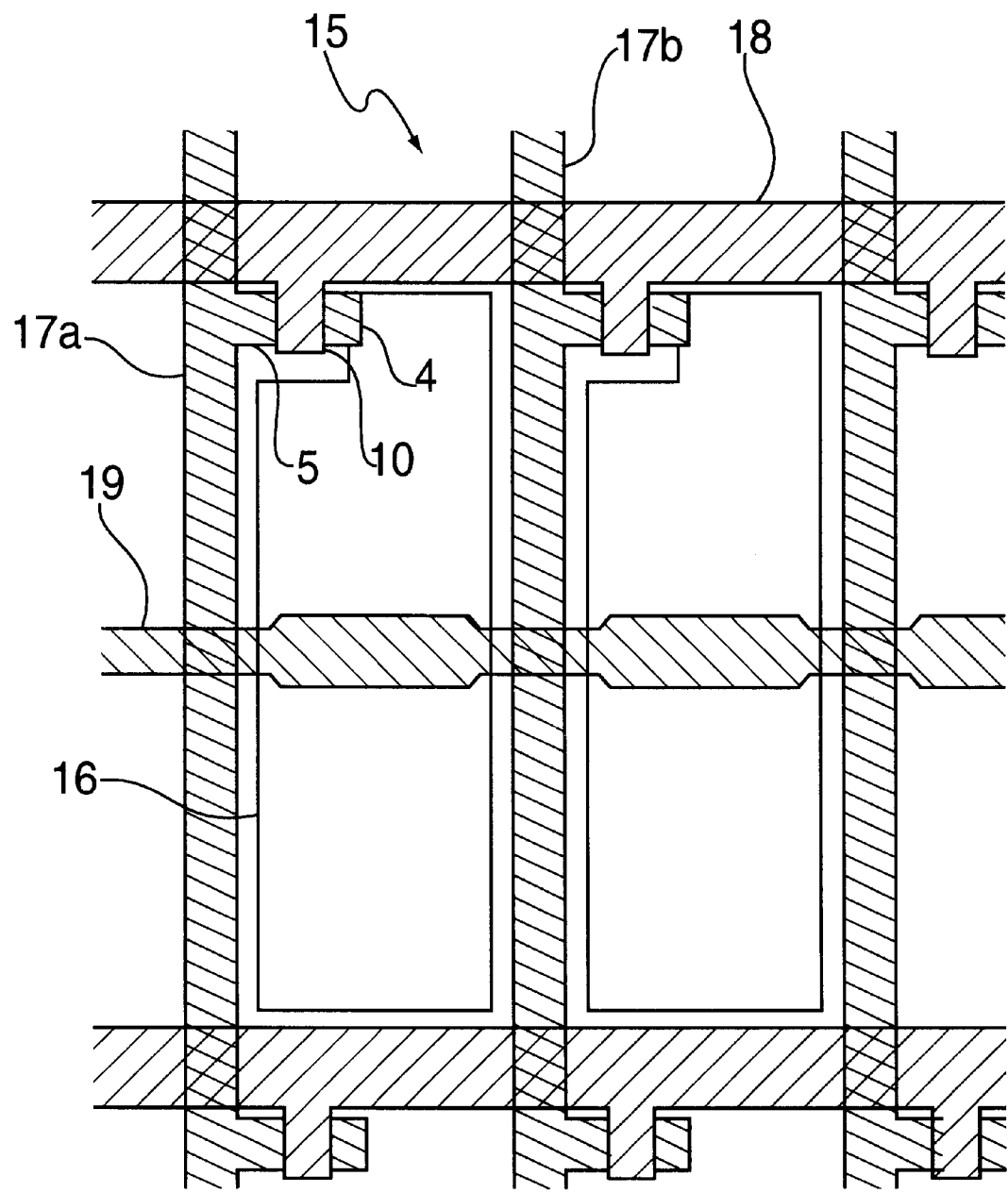
FIG. 8 shows a plane view of a semiconductor device including an active matrix type TFT arrangement where the TFTs are formed according to the present invention.

FIG. 8 shows a plane view of a semiconductor device including an active matrix type TFT arrangement where the TFTs are formed according to the present invention. The semiconductor device according to the present invention is constructed on the TFT array substrate 15 and a plurality of pixel electrodes 16 are disposed on the substrate 15. The pixel electrodes 16 may be formed from any suitable material depending on a particular application. For example, when the semiconductor device is used as an active matrix type liquid crystal display device, the pixel electrodes 16 may be formed by transparent electrically conductive material such as ITO, IZO, ATO, or $SnO_2$. The source electrode 4 is connected to the pixel electrode 16 and the drain electrode 5 is connected to the signal line 17a. The gate electrode 10 is formed on the source and drain electrodes 4, 5 and is connected to the gate line 18. In the described embodiment in FIG. 8, the capacitance control line 19 is provided.

When the semiconductor device is used as an active matrix type electro-luminescence display device, the same electrically conductive material may be used, however, any electrically conductive material with sufficient conductivity may be adopted without regarding the transparency. When the semiconductor device is used as a sensor such as CCD, the pixel electrodes 16 may be replaced with photo-carrier generating material such as a-Si, a single crystal or poly-crystalline Si. In the application to CCD, the entire structure may be constructed on the single crystal silicon substrate.

The TFTs included in the semiconductor device exhibit an excellent electronic performance with an improved switching property originated from the poly-Si layer formed by the metal induced lateral crystallization and uniform creation of the contact layer. In addition, the TFT according to the present invention can be structured through simplified process excluding doping step and simplified PEP process, therefore the production cost of the semiconductor device is significantly reduced according to the present invention.

While the invention has been particularly shown and described with respect to preferred embodiments thereof, it will be understood by those skilled in the art that the foregoing and other changes in form and details may be made therein without departing form the spirit and scope of the invention.

Having thus described our invention, what we claim as new, and desire to secure by Letters Patent is:

1. A semiconductor device comprising a top-gate type thin film transistor (TFT), said top-gate type TFT being formed on a substrate, said top-gate type TFT comprising:
    an insulating layer deposited on said substrate;
    a source electrode and a drain electrode formed from a metal-dopant compound, said metal-dopant compound being deposited on said insulating layer;
    a polycrystalline Si (poly-Si) layer deposited on said insulating layer and said source electrode and said drain electrode;
    an ohmic contact layer being formed between said metal-dopant compound and said poly-Si layer through migration of said dopant from said metal-dopant compound;
    a gate insulating layer deposited on said poly-Si layer; and
    a gate electrode formed on said gate insulating layer, wherein said poly-Si layer is crystallized by metal induced lateral crystallization.

2. The semiconductor device according to the claim 1, wherein said metal-dopant compound comprises the elements selected from the group consisting of Ni, Fe, Co, Pt, Mo, Ti, B, and P.

3. The semiconductor device according to the claim 1, wherein said metal-dopant compound is NiP or NiB.

4. The semiconductor device according to the claim 1, wherein said metal-dopant compound is NiP and a concentration of P ranges from 0.5 at % to 10 at %.

5. The semiconductor device according to the claim 1, wherein said metal-dopant compound is NiB and a concentration of B ranges from 0.25 at % to 2.0 at %.

6. The semiconductor device according to the claim 1, wherein a light shielding layer is formed on said substrate and a plurality of said TFTs are arrayed to form an active matrix in said semiconductor device such that said semiconductor device is used as an active matrix liquid crystal display.

7. The semiconductor device according to the claim 1, wherein a plurality of said TFTs are arrayed to form an active matrix in said semiconductor device such that said semiconductor device is used as an active matrix electro-luminescence display, or an image sensor.

8. A top-gate type thin film transistor (TFT), said top-gate type TFT being formed on a substrate, said top-gate type TFT comprising:
    an insulating layer deposited on said substrate;
    a source electrode and a drain electrode formed from a metal-dopant compound, said metal-dopant compound being deposited on said insulating layer;
    a polycrystalline Si (poly-Si) layer deposited on said insulating layer and said source electrode and said drain electrode;
    an ohmic contact layer being formed between said metal-dopant compound and said poly-Si layer through migration of said dopant from said metal-dopant compound;
    a gate insulating layer deposited on said poly-Si layer; and
    a gate electrode formed on said gate insulating layer, wherein said poly-Si layer is crystallized by metal induced lateral crystallization.

9. The top-gate type TFT according to the claim 8, wherein said metal-dopant comprises the elements selected from the group consisting of Ni, Fe, Co, Pt, Mo, Ti, B, and P.

10. The top-gate type TFT according to the claim 8, wherein said metal-dopant compound is NiP or NiB.

11. The top-gate type TFT according to the claim 8, wherein said metal-dopant compound is NiP and a concentration of P ranges from 0.5 at % to 10 at %.

12. The top-gate type TFT according to the claim 8, wherein said metal-dopant compound is NiB and a concentration of B ranges from 0.25 at % to 2.0 at %.

13. The top-gate type TFT according to the claim 8, wherein a light shielding layer is formed on said substrate and a plurality of said TFTs are arrayed to form an active matrix such that said top-gate type TFTs are included in an active matrix liquid crystal display.

14. The top-gate type TFT according to the claim 8, wherein a plurality of said TFTs are arrayed to form an active matrix such that said top-gate type TFTs are included in an active matrix electro-luminescence display, or an image sensor.

* * * * *